US005742844A

United States Patent [19]
Feldman

[11] Patent Number: 5,742,844
[45] Date of Patent: Apr. 21, 1998

[54] IBM PC COMPATIBLE MULTI-CHIP MODULE

[75] Inventor: David L. Feldman, Menlo Park, Calif.

[73] Assignee: ZF Microsystems, Inc., Palo Alto, Calif.

[21] Appl. No.: 564,688

[22] Filed: Nov. 29, 1995

[51] Int. Cl.$^6$ .............................. G06F 15/16; H01L 23/48; H01L 23/50

[52] U.S. Cl. .................... 395/800.32; 395/882; 361/718; 361/719; 361/728; 361/736; 361/737; 361/748; 361/760; 361/761; 361/764

[58] Field of Search ............................. 395/830, 800.32, 395/882; 361/728, 736, 737, 748, 760, 761, 764, 718, 719

[56] References Cited

PUBLICATIONS

"Personal Computer Bus Standard P 1996," IEEE, 1991, pp. i–xiv and 1.1 to A.17.
Intel 386 SL . . . Superset, System design Guide, 1992, pp. 1–1 to 2–13, 7–1 to 7–25 and D–4, 1992.
Intel 486SL . . . Superset, System design Guide, 1992, pp. 1–1 to 2–11 and 5–1 to 5–24, 1992.
Data Sheet, S–MOS Systems, (1994).
MicroModlue Adds to Northstar, CMP Publications, (Mar. 27, 1995).
Advance Information re NorthStar III–100 and III–90, MicroModule Systems, 1–11.

Primary Examiner—Alyssa H. Bowler
Assistant Examiner—John Follansbee
Attorney, Agent, or Firm—William B. Walker

[57] ABSTRACT

A multi-chip module and a chip set that comprises a plurality of the multi-chip modules. The multi-chip module includes a plurality of functional circuits provided on a substrate, the circuits defining a plurality of signal inputs and outputs. A plurality of pins are secured in a single row along the periphery of the substrate and are connected to the inputs and outputs. The pins include a set of 91 signal pins, two ground pins, and a power pin, the signal pins having a configuration complying in number and signal type with the IEEE-Prequirements to define an ISA bus. The multi-chip module includes a rectangular housing wherein the pins, in the form of gull wing pins, extend laterally from a peripherally extending wall. The ISA bus pins extend along one side and partially along adjacent sides of the rectangular module. The functional circuits of one embodiment of the module include a CPU, serial interfaces, a parallel interface, a hard drive interface, a floppy disk interface, a keyboard interface, and flash memory. Other multi-chip modules can include a PCMCIA interface, an Ethernet interface, or a display controller.

2 Claims, 5 Drawing Sheets

IBM PC COMPATIBLE MULTI-CHIP MODULE

FIELD OF THE INVENTION

This invention relates to a multi-chip module.

BACKGROUND OF THE INVENTION

The most successful applications of computer technology have been those that people do not see. Microcontrollers and microprocessors govern automotive anti lock braking systems, automatic teller machines, elevators, subway ticket systems, and medical equipment. These hidden computers, otherwise known as embedded systems, permeate our lives. The embedded control market is, in fact, growing significantly faster than the desk top computing market. A major trend is the move from 4- and 8-bit processors to more powerful devices that provide more computing power and enable more "friendly" man-machine interfaces. A study by Desk Top Strategies showed that in 1994 over 320 million 16- and 32-bit embedded control processors were shipped to original equipment manufacturers (OEMs) for use in embedded control applications. In contrast, only 50 million were shipped to desk top computer manufacturers. The compound annual growth rate for 32-bit processors in the embedded market from 1992 to 1997 is projected to be 53 percent, compared with an estimated 32 percent in the desk top market.

The area of greatest growth in the embedded control market is the segment of ultra-miniature controllers for portable and transportable instruments. OEMs have indicated a strong interest in developing products with the PC architecture, but have found that size, integration, power, reliability, or cost constraints make existing broad-level products unsuitable for their applications.

The Cardio 386 developed by S-Mos Systems comprises a full function, small footprint, X86 computer that includes a CPU, all standard PC-type I/O controllers, PGA graphics, floppy and hard disk drive interfaces, DRAM, flash memory, and transparent power management. It adopts a PC AT architecture which complies with the ISA (industry standard architecture) bus pin configuration. However, it makes use of a unique edge connector comprising a plurality of tracks formed into rows on a card. This is received in a complementary slot for connection to peripheral devices. The use of a connector for connecting the module to a board makes its implementation inherently unreliable since vibrations can compromise the electrical connections between the various tracks forming the pins, and the corresponding contacts of the slot connector. Furthermore, no provision is made for integrating the module with proprietary hardware of OEMs (original equipment manufacturers).

Another prior art device is the Northstar III by Micro Module Systems that comprises a multi-chip module, including a Pentium processor, a cache controller, and RAM incorporated in a 349 pin PGA package. Once again, no facility is provided for interfacing with OEM proprietary hardware. Furthermore, the North Star module is packaged in a 349 pin PGA which makes simple direct connection to peripheral devices impossible without complicated track layout design. Therefore it does not allow the module to be simply dropped into an OEM system.

OBJECTS AND SUMMARY OF THE INVENTION

It is an object of the invention to incorporate a multi-chip module in an ultra-miniature form factor. In particular it is an object of the invention to provide a module the size of a large integrated circuit.

It is a further object of the invention to provide an Intel X86 compatible computer module and peripheral controller modules wherein the computer module includes a CPU, I/O (a parallel port and two serial ports), a keyboard interface, a DRAM interface, floppy disk controller, hard disk controller, and flash disk functions based on Intel X86 architecture. Specifically, it is an object of the invention to provide a multi-chip module that provides an OEM (Original Equipment Manufacturer) with the facility for incorporating a feature set that is compatible with IBM PC/AT hardware, software, and bus pin configuration.

It is a further object of the invention to provide a module having low power consumption, broad thermal adaptability, low cost, and high reliability by eliminating cables and mounting hardware.

It is yet a further object of the invention to provide a module family having identical ISA bus pin configurations to facilitate easy interconnection.

It is yet a further object of the invention to provide a development board to form a platform for receiving a multi-chip module of the invention, thereby to provide for the quick development of pilot projects.

According to the invention there is provided a multi-chip module comprising a plurality of functional circuits provided on a substrate, the circuits defining a plurality of signal inputs and outputs, and a plurality of module pins secured in a single row along the periphery of the substrate and connected to the inputs and outputs, the module pins including a set of 91 pins, two ground pins, and a power pin, defining an ISA bus means, the signal pins having a configuration complying in number and signal type with the signal pins laid down under the IEEE-P996 specification, and as applied in the ISA (Industry Standard Architecture) requirements. For this reason it will hereinafter be referred as to as the ISA bus.

The module can be rectangular in shape, having a first side, a second side opposite the first side, a third side, and a fourth side, and is defined by an upper surface, a lower surface, and a peripheral wall, and wherein the plurality of pins extend from the peripheral wall.

The pins of the ISA bus means of the present invention preferably comprise: pin 38 corresponding to signal SA0; pin 39 corresponding to signal OSC; pin 40 corresponding to signal SA1; pin 41 corresponding signal SA2; pin 42 corresponding to signal BALE; pin 43 corresponding to signal SA3; pin 44 corresponding to signal SD15; pin 45 corresponding to signal TC; pin 46 corresponding to signal SA4; pin 47 corresponding to signal MASTER-; pin 48 corresponding to signal SD14; pin 49 corresponding to signal DACK2-; pin 50 corresponding to signal SA5; pin 51 corresponding to signal SD13; pin 52 corresponding to signal IRQ3; pin 53 corresponding to signal SA6; pin 54 corresponding to signal DRQ7; pin 55 corresponding to signal SD12; pin 56 corresponding to signal IRQ4; pin 57 corresponding to signal SA7; pin 58 corresponding to signal DACK7-; pin 59 corresponding to signal SD11; pin 60 corresponding to signal IRQ5; pin 61 corresponding to signal SA8; pin 62 corresponding to signal DRQ6; pin 63 corresponding to signal SD10; pin 64 corresponding to signal IRQ6OUT; pin 65 corresponding to signal IRQ6; pin 66 corresponding to signal SA9; pin 67 corresponding to GND; pin 68 corresponding to signal DACK6-; pin 69 corresponding to signal SD9; pin 70 corresponding to signal IRQ7OUT; pin 71 corresponding to signal IRQ7; pin 72 corresponding to signal SA10; pin 73 corresponding to signal DRQ5; pin 74 corresponding to signal SD8; pin 75 corresponding to signal SYSCLK; pin 76 corresponding to signal SA11; pin 77 corresponding to signal DACK5-; pin 78 corresponding to signal MEMW-; pin 79 corresponding to signal REFRESH-; pin 80 corresponding to signal SA12; pin 81 corresponding to signal DRQ0; pin 82 corresponding to signal MEMR-; pin 83 corresponding to signal DRQ1; pin 84 corresponding to signal SA13; pin 85 corresponding to VCC; pin 86 corresponding to signal DACK0-; pin 87 corresponding to signal LA17; pin 88 corresponding to signal DACK1-; pin 89 corresponding to signal SA14; pin 90 corresponding to signal IRQ14; pin 91 corresponding to signal LA18; pin 92 corresponding to signal DRQ3; pin 93 corresponding to signal SA15; pin 94 corresponding to signal IRQ15; pin 95 corresponding to signal LA19; pin 96 corresponding to signal DACK3-; pin 97 corresponding to signal SA16; pin 98 corresponding to signal IRQ12; pin 99 corresponding to signal LA20; pin 100 corresponding to signal IOR-; pin 101 corresponding to signal SA17; pin 102 corresponding to GND; pin 103 corresponding to signal IRQ11; pin 104 corresponding to signal LA21; pin 105 corresponding to signal IOW-; pin 106 corresponding to signal SA18; pin 107 corresponding to signal IRQ10; pin 108 corresponding to signal LA22; pin 109 corresponding to signal SMEMR-; pin 110 corresponding to signal SA19; pin 111 corresponding to signal IOCS16-; pin 112 corresponding to signal LA23; pin 113 corresponding to signal SMEMW-; pin 114 corresponding to signal AEN; pin 115 corresponding to signal MEMCS16-; pin 116 corresponding to signal SBHE-; pin 117 corresponding to signal IOCHRDY; pin 118 corresponding to signal SD00; pin 119 corresponding to signal (0WS-); pin 120 corresponding to signal SD1; pin 121 corresponding to signal SD2; pin 122 corresponding to signal DRQ2OUT; pin 123 corresponding to signal DRQ2; pin 124 corresponding to signal SD3; pin 125 corresponding to signal SD4; pin 126 corresponding to signal IRQ9; pin 127 corresponding to signal SD5; pin 128 corresponding to signal SD6; pin 129 corresponding to signal RESETDRV; pin 130 corresponding to signal SD7; and pin 131 corresponding to signal IOCHCK-. The ISA bus pins preferably extend along the first side and at least partially along the third and fourth sides. The multi-chip module can include 240 module pins.

The functional circuits in a module can include a central processing unit. The functional circuits can further include two serial interfaces, a parallel interface, a hard drive interface, a floppy disk interface, a keyboard interface, and flash memory.

Other modules can include functional circuits that include a PCMCIA interface, an Ethernet interface, or a display controller.

The substrate can comprise a printed circuit board and the functional circuits comprise semiconductor devices which can be packaged or can be in bare die form secured to the printed circuit board.

Further, according to the invention, there is provided a multi-chip module comprising a plurality of functional circuits encapsulated in a rectangular housing, the housing having an upper surface and a lower surface, and a peripheral wall extending along a first side, a second side opposite the first side, a third side, and a fourth side; and a plurality of pins extending laterally from the peripheral wall, wherein the pins include a set of 91 signal pins, two ground pins and a power pin defining an ISA bus means, the signal pins of which comply in number and signal type, with the signal pins laid down under the IEEE-P996, and as applied in the ISA (Industry Standard Architecture) requirements.

Still further, according to the invention, there is provided a module family comprising a plurality of functionally different modules, wherein each module has a plurality of pins and the pins of each module include a set of 91 signal pins, two ground pins, and a power pin, defining an ISA bus means, the signal pins of which comply in number and signal type with the signal pins laid down under the IEEE-P996, and as applied in the ISA (Industry Standard Architecture) requirements.

Each module can comprise at least one functional circuit encapsulated in a rectangular housing, the housing having an upper surface and a lower surface, and a peripheral wall extending along a first side, a second side opposite the first side, a third side, and a fourth side, and wherein the pins of the module extend laterally from the peripheral wall.

DESCRIPTION OF PREFERRED EMBODIMENTS

A need exists in the field of embedded applications for small, highly reliable computer systems that draw little power, are easy to integrate, have broad thermal adaptability and are relatively inexpensive. Applications for such devices include medical instruments, data logging devices, security systems, test equipment, point-of-sale terminals, communications devices, such as Internet and facsimile machines, and navigational instruments. OEMs (original equipment manufacturers) typically use the Intel X86 architecture since it offers the world's largest body of hardware and software. The present invention has accordingly been developed to address the problems in the prior art by providing a multi-chip module packaged to resemble a large integrated circuit chip comprising a 240 pin QFP having an overall footprint of 59.54×79.88 min. The module includes a set of pins constituting a bus for connection to the OEM designer's proprietary internal hardware. The invention specifically contemplates providing this bus with a configuration complying with the ISA (Industry Standard Architecture) requirements. This will allow the OEM designer quickly to incorporate IBM PC/AT hardware and software and to implement the module in ISA compatible proprietary product designs. The module is now described in greater detail with reference to FIGS. 1 and 2 which show a plan view and a side view, respectively, of the module.

Figure 1:
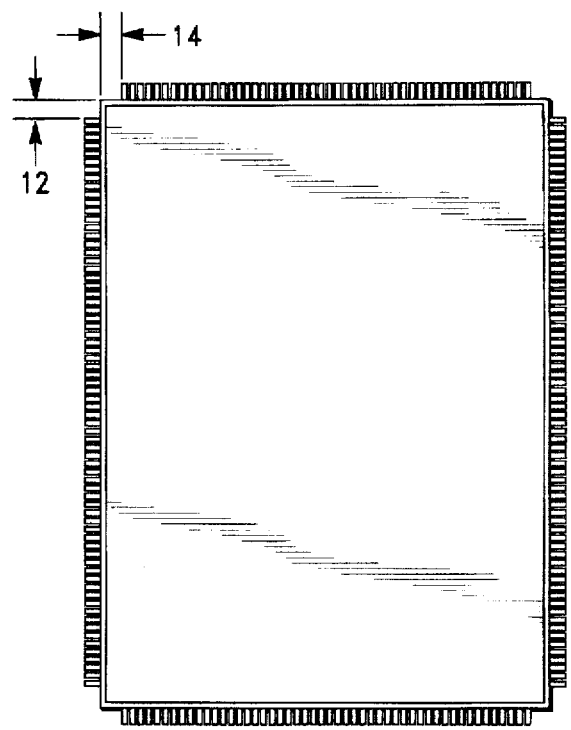
FIG. 1 is a plan view of a multi-chip module of the invention.
Figure 2:
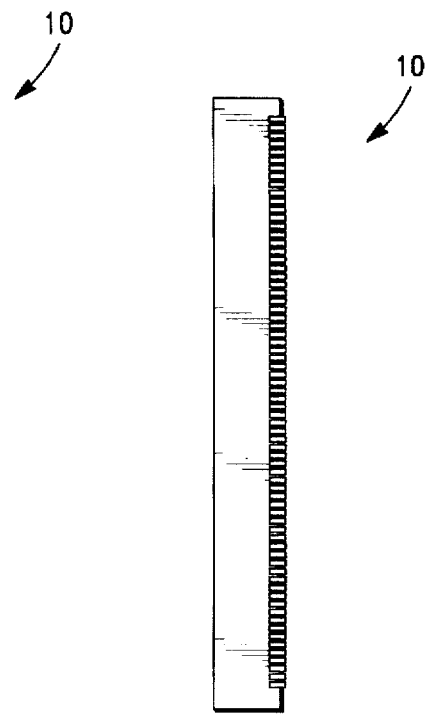
FIG. 2 is a side view of the module of FIG. 1.

The module 10 is a 240 pin QFP with gull wing pins having a 0.762 mm. pitch. The body is rectangular, the one side of which measures 76.2 mm and the overall footprint in this embodiment being 59.54×79.88 mm. The pins themselves are typically 0.5 mm wide, and the dimensions of distances 12 and 14 in FIG. 1 are 3.5 mm for this embodiment. By using a chip-like package in which the pins are formed around the periphery of the module 10 in a single row as illustrated in FIGS. 1 and 2, the module 10 can easily be soldered into place to form a very sturdy, reliable set of connections. Furthermore, tracks can be designed to lead directly from the pins to another device by making use of PC board tracks on one or both surfaces of the PC board without the need for several layers to route the various tracks. Since the pins are soldered directly to the interconnecting tracks, the system has inherent reliability in that it eliminates cables and mounting hardware that could otherwise vibrate loose. As many as half a dozen interconnecting cables, assorted connectors and mounting hardware required with many existing prior art single board computers, are thereby eliminated.

The module thus provides an Intel X86 compatible computer in an ultra-miniature form factor that can be integrated as easily as a semiconductor device and provides the full functionality of a desk top computer. As is described in greater detail below, the same concepts of using a chip-like module using a QFP package with gull wing pins and having an ISA compatible bus is extended also to peripheral controller modules.

By integrating a full X86 AT-compatible computer onto a proprietary OEM design, the need for multiple boards is eliminated, thereby eliminating cables and mounting hardware.

The full compatibility with PC-AT ISA allows for easy integration with low-cost hardware peripherals. The ISA, compliant bus makes it easy to interface with proprietary hardware design.

Figure 3:
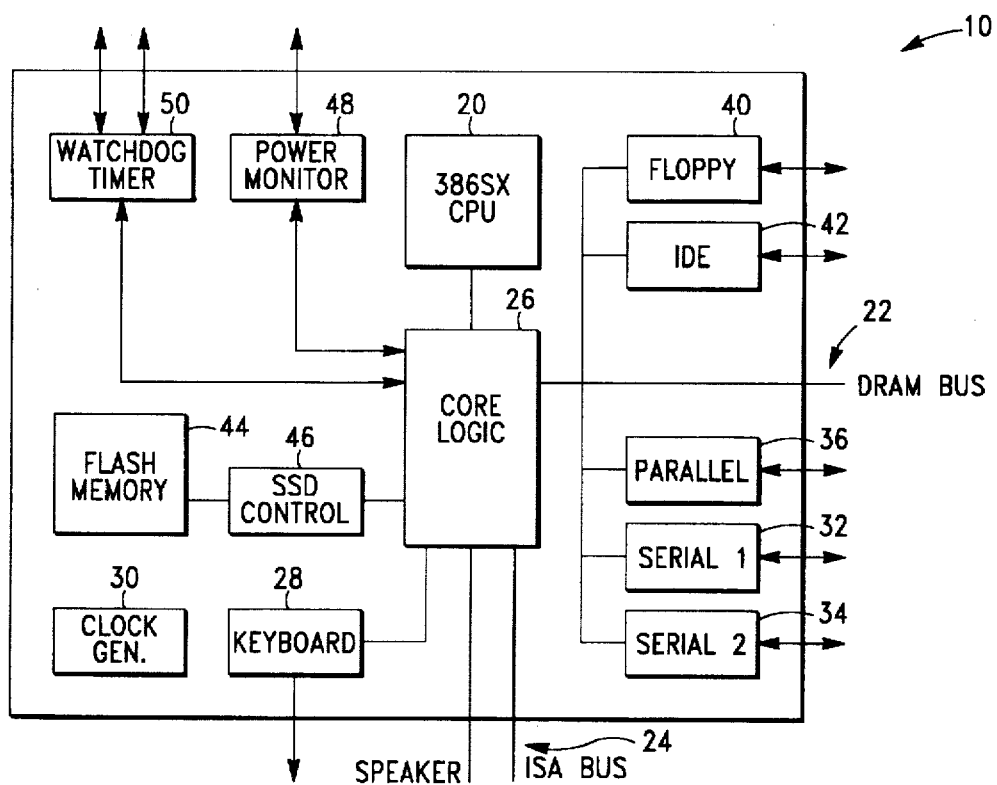
FIG. 3 is a block diagram of a multi-chip module of the invention.

One embodiment of the module 10, having a CPU as one of its functional circuits, is illustrated in FIG. 3 and includes the standard I/O interfaces, serial ports, a parallel port, and floppy and hard disk interfaces allowing standard hardware, cables, and software libraries to be incorporated in the design. The module 10 includes an 80386 SX CPU 20 which is connected to a DRAM bus and an ISA bus 24 by means of core logic 26. The core logic controls AT-compatible DMA controllers, interrupt controllers, and timers/counters. It also controls the AT keyboard controller 28 and the real time clock 30. Two serial ports 32, 34 and a parallel port 36 are provided, as are a floppy disk controller 40 and an IDE hard drive interface 42. In order to facilitate total solid state operation, internal flash memory 44 is provided that is controlled by a solid state flash disk controller 46. Power is controlled by means of a power monitor 48 that provides a power saving function by controlling CPU sleep modes, and by a watch dog timer 50. The watch dog timer 50 monitors CPU cycles to detect interrupts in the cycle thereby allowing the system to be automatically reset after a predetermined time delay.

The microprocessor and various controllers and interfaces comprise chips, preferably in die form, mounted on a multi-layer PC board, e.g. ten-layers. The CPU 20 is a standard 33 MHz 80386 SX CPU having a DRAM controller for supporting up to 16M bytes of DRAM.

The standard DRAM interface provides all the signals for connecting standard page-mode DRAMs of various configurations, including standard 8- and 9-bit 30-pin SIMM modules and discrete components, such as standard 1M×4 and 4M×4 DRAM chips. The interface is designed to support 70 ns or faster DRAMs. The DRAM interface consists of:

- Multiplexed addresses  MA00–MA10
- Bidirectional data  D0–D15
- Column Address Strobes  CASL0- to CASL3- (low byte) CASH0- to CASH3- (high byte)
- Row Address Strobes  RAS0- to RAS3-
- Memory Write Strobe  DRWE- The serial ports 32, 34 are PC-compatible asynchronous serial ports, typically treated as COM 1 and COM 2 devices by DOS.

| Serial Port | Typical Usage | I/O Address | Standard Interrupt |
|---|---|---|---|
| Serial 1 | COM1 | 3F8-3FF | IRQ4 |
| Serial 2 | COM2 | 2F8-2FF | IRQ3 |

Serial Port Rersources

Either or both serial ports can be disabled using SETUP. When disabled, the port's I/O address and interrupt are made available for other expansion devices on the PC bus.

A full complement of input and output handshaking lines are supported by the serial ports, and all serial port signals are at standard LSTTL levels. In another embodiment, RS232C signal compatibility can be achieved by including a TTL-RS232C level converter to provide the necessary bipolar signal levels. The parallel port is a fully-compatible PC/AT parallel port providing bidirectional operation. It is typically used to support a line printer. As appears from the table below:

| Parallel Port | Typical Usage | I/O Address | Standard Interrupt |
|---|---|---|---|
| Parallel 1 | LPT1 | 378 | IRQ7 |

Parallel Port Resources 4.7K-ohm pull-ups (+5 V) are typically provided to the following parallel port signals:
STROBE-
SLIN-
INIT-
AUTOFD- Generally, if the parallel port will be connected to a cable for high speed data communication (as opposed to static digital output levels or static TTL level sensing), certain signals require a 2.2 nF capacitor connected to ground. These include:
PD0–PD7
STRB- Parallel port registers are provided for the parallel port as appears from the table set out below:

| Register | Bit | Signal Name | In/Out | Active High/Low | DB25F Pin |
|---|---|---|---|---|---|
| DATA | 0 | PD0 | I/O | HIGH | 2 |
| (A+0) | 1 | PD1 | I/O | HIGH | 3 |
|  | 2 | PD2 | I/O | HIGH | 4 |
|  | 3 | PD3 | I/O | HIGH | 5 |
|  | 4 | PD4 | I/O | HIGH | 6 |
|  | 5 | PD5 | I/O | HIGH | 7 |
|  | 6 | PD6 | I/O | HIGH | 8 |
|  | 7 | PD7 | I/O | HIGH | 9 |

| Register | Bit | Signal Name | In/Out | Active High/Low | DB25F Pin |
|---|---|---|---|---|---|
| STATUS (A+1)) | 0 | 1 | — | — | — |
|  | 1 | 1 | — | — | — |
|  | 2 | 1 | — | — | — |
|  | 3 | ERROR- | IN | LOW | 15 |
|  | 4 | SLCT- | IN | HIGH | 13 |
|  | 5 | PE | IN | HIGH | 12 |
|  | 6 | ACK- | IN | HIGH | 10 |
|  | 7 | BUSY | IN | LOW | 11 |
| CONTROL | 0 | STRB- | OUT | LOW | 1 |
|  | 1 | AUTOFD- | OUT | LOW | 14 |
| (A+2) | 2 | INIT- | OUT | HIGH | 16 |
|  | 3 | SLCTIN- | OUT | LOW | 17 |
|  | 4 | IRQ ENABLE | — | HIGH | — |
|  | 5 | 1 | — | — | — |
|  | 6 | 1 | — | — | — |
|  | 7 | 1 | — | — | — |

Parallel Port Registers

The DOS-compatible floppy drive interface 40 allows cable connections for up to four floppy drives. In PC-compatible systems, the BIOS and DOS support two drives. These are configured using the BIOS SETUP function. Hardware controls for two additional drives are provided.

The floppy drive interface supports the following standard floppy formats:

| Capacity | Drive Size | Tracks | Data Rate |
|---|---|---|---|
| 360K | 5¼ inch | 40 | 250 KHz |
| 1.2M | 5¼ inch | 80 | 500 KHz |
| 720K | 3½ inch | 80 | 250 KHz |
| 1.44M | 3½ inch | 80 | 500 KHz |

The various floppy interface resources are given in the table below

| Resource | Function |
|---|---|
| I/O Address 3F0h–3F7h | 3F2 FDC Digital Output Register (LDOR) |
|  | 3F4 FDC Main Status Register |
|  | 3F5 FDC Data Register |
|  | 3F7 FDC Control Register (LDCR) |
| IRQ6 | Interrupt |
| DRQ2-DACK2 | DMA Controller Channel |

Floppy Interface Resources

Outputs to the floppy drive and from the floppy drive are "open collector". Pull-up resistors are therefore required for proper termination, both on the SMX/386 board and on one of the attached floppy drives (not both).

330-Ohm pull-ups are required for the following floppy interface signals:

DSKCHG-

RDATA-

WRPRT-

TRK0-

INDEX-

The pin numbers and functions associated with the floppy drive are given in the table below:

| Pin | Floppy Pin | Signal Name | Function | In/Out |
|---|---|---|---|---|
| 11 | 2 | DENSEL | Speed/Precomp |  |
|  | 4 | N/A |  | N/A |
|  | 6 | N/S | Key pin | N/A |
| 12 | 8 | INDEX- | Index Pulse | IN |
| 13 | 10 | MTR0- | Motor On 0 | OUT |
| 15 | 12 | DRV1- | Drive Select 2 | OUT |
| 18 | 14 | DRV0- | Drive Select 1 | OUT |
| 20 | 16 | MTR1- | Motor On 1 | OUT |
| 22 | 18 | DIR- | Direction Select | OUT |
| 23 | 20 | STEP- | Step Pulse | OUT |
| 24 | 22 | WDATA- | Write Data | OUT |
| 25 | 24 | WGATE- | Write Gate | OUT |
| 26 | 26 | TRK0- | Track 0 | INPUT |
| 27 | 28 | WRPRT- | Write Protect | INPUT |
| 28 | 30 | RDATA- | Read Data | INPUT |
| 29 | 32 | HDSEL- | Head Select | OUT |
| 30 | 34 | DSKCHG- | Disk Change | INPUT |
|  | 1–33 | Ground | Ground |  |

Floppy Drive Interface

The IDE hard drive interface 42 is a standard interface used in PC-compatible systems for hard disk drives. Up to two drives can be connected in a master-slave arrangement. The resources are depicted in the table below:

| Resource | Function |
|---|---|
| I/O Address 1F0h–1F7h | Hard Disk Interface |
| IRQ14 | Interrupt |

IDE Hard Disk Resources

The IDE interface pins are arranged to easily attach to a male PC-mounted ribbon-cable connector, the IDE drives typically being attached to the drive interface using a 40-pin ribbon cable.

The pin configuration for the IDE interface is given in the table below:

| Pin | IDE Pin | Signal Name | Function | In/Out |
|---|---|---|---|---|
| 223 | 1 | HDRESET- | Reset signal from host | OUT |
|  | 2 | GND | Ground | OUT |
| 224 | 3 | IDED07 | Data bit 7 | I/O |
| 225 | 4 | HDD08 | Data bit 8 | I/O |
| 226 | 5 | HDD06 | Data bit 6 | I/O |
| 227 | 6 | HDD09 | Data bit 9 | I/O |
| 228 | 7 | HDD05 | Data bit 5 | I/O |
| 229 | 8 | HDD10 | Data bit 10 | I/O |
| 230 | 9 | HDD04 | Data bit 4 | I/O |
| 231 | 10 | HDD11 | Data bit 11 | I/O |
| 232 | 11 | HDD03 | Data bit 3 | I/O |
| 233 | 12 | HDD12 | Data bit 12 | I/O |
| 234 | 13 | HDD02 | Data bit 2 | I/O |
| 235 | 14 | HDD13 | Data bit 13 | I/O |
| 236 | 15 | HDD01 | Data bit 1 | I/O |
| 237 | 16 | HDD14 | Data bit 14 | I/O |
| 238 | 17 | HDD00 | Data bit 0 | I/O |
| 239 | 18 | HDD15 | Data bit 15 | I/O |
|  | 19 | GND | Ground | OUT |
|  | 20 | KEY | Keyed pin | N/C |
|  | 21 | N/A | Reserved | N/C |
|  | 22 | GND | Ground | OUT |
| 240 | 23 | HDIOW- | Write strobe | OUT |
|  | 24 | GND | Ground | OUT |
| 1 | 25 | HDIOR- | Read strobe | OUT |
|  | 26 | GND | Ground | OUT |
|  | 27 | RSVD | Reserved | N/C |
| 2 | 28 | HDALE | Address latch enable | OUT |

-continued

| Pin | IDE Pin | Signal Name | Function | In/Out |
|---|---|---|---|---|
|  | 29 | RSVD | Reserved | N/C |
|  | 30 | GND | Ground | OUT |
| 237 | 31 | HDD14 | Drive Interrupt request IDE Drive Interface | IN |

Figure 4A:
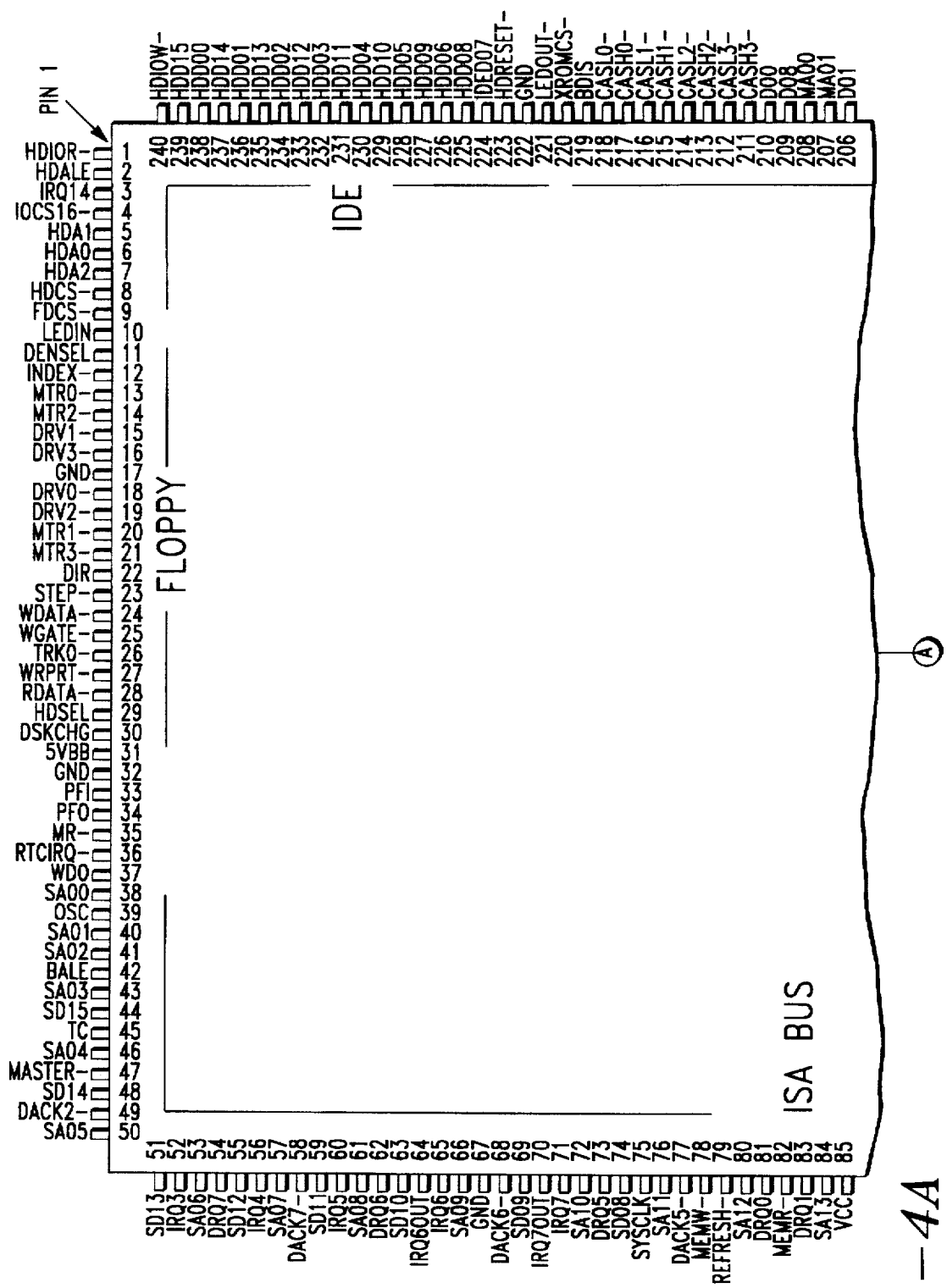
FIG. 4 is a schematic representation of a multi-chip module of the invention indicating the configuration of the pins.
Figure 4B:
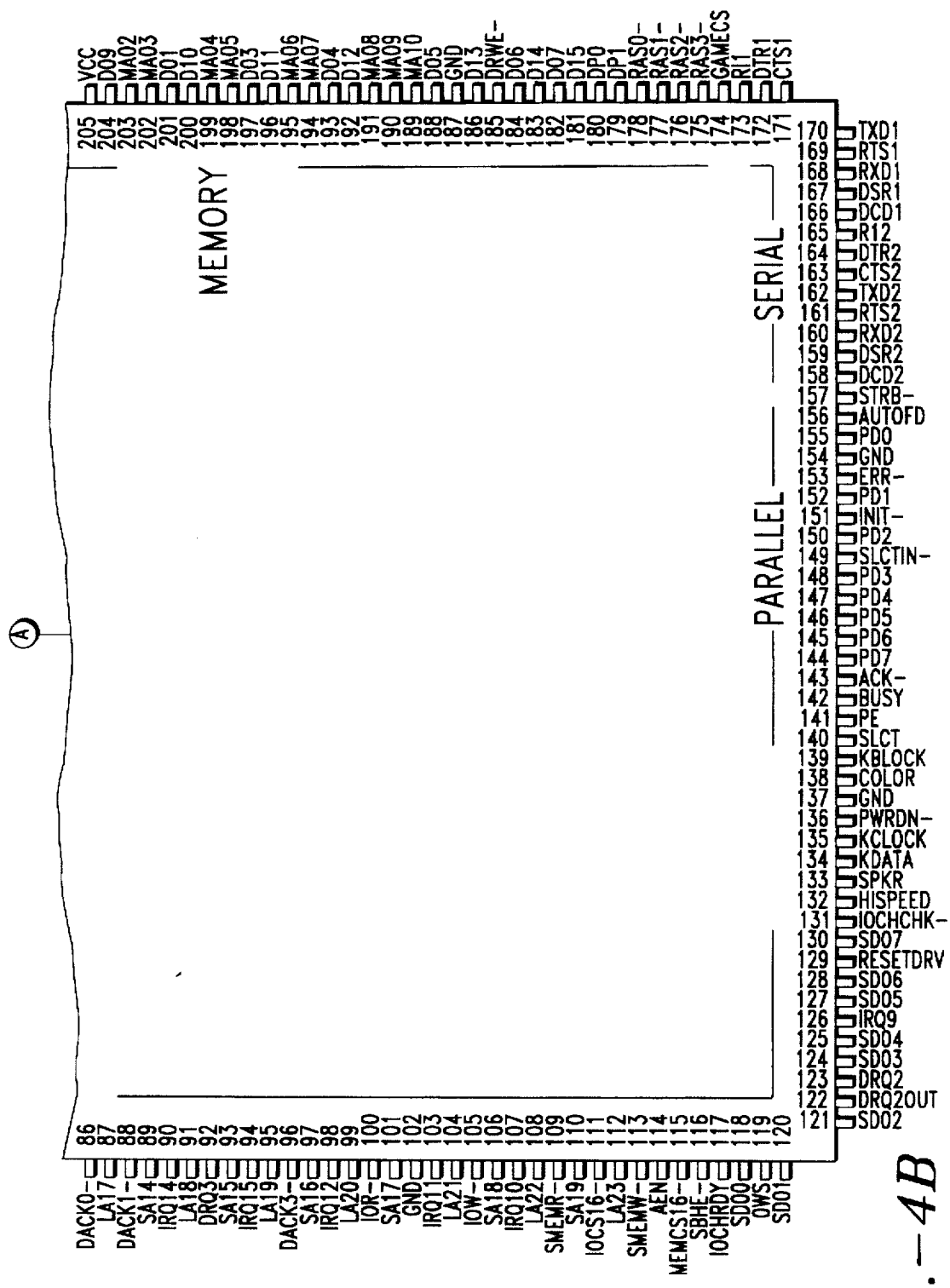

The pin configuration for the module 10 as a whole is illustrated in FIG. 4 and is given in the pin description table below:

| Pin | Pin Name | Description | Type |
|---|---|---|---|
| 1 | HDIOR- | IDE I/O Read, active low. Buffered version of IOR | O24 |
| 2 | HDALE | IDE Address Latch Enable, active high. Buffered version of BALE | O24 |
| 3 | IRQ14 | IDE Interrupt Request 14. For use with IDE interface. Same signal appears on pin 90. | I |
| 4 | IOCS16 | IDE I/O Chip Select 16. A low requests a 16-bit transfer on the SA bus. Same signal appears on pin 238. This one is used for the IDE interface. | I |
| 5 | HDA1 | IDE Address 1. Buffered version of SA1. | O24 |
| 6 | HDA0 | IDE Address 0. Buffered version of SA0 | O24 |
| 7 | HDA2 | IDE Address 2. Buffered version of SA2 | O24 |
| 8 | HDCS- | IDE Chip Select. A low indicates that data is being transferred to or from the IDE drive. | O24 |
| 9 | FDCS- | Floppy disk Chip Select. A low indicates that data is being transferred to or from the floppy disk. | O24 |
| 10 | LEDIN | LED signal from IDE drive | I |
| 11 | DENSEL |  |  |
| 12 | IDEX | Floppy disk index pulse, input from drive | I |
| 13 | MTR0- | Floppy disk active lower open drain output selects motor driver 0. The motor enable bits are software controlled via the floppy's Digital Output Register (DOR). |  |
| 14 | MTR2- | Floppy disk active low open drain output selects motor driver 2. The motor enable bits are software controlled via the floppy's Digital Output Register (DOR). |  |
| 15 | DRV1- | Floppy disk active lower open drain output that selects floppy drive 1 |  |
| 16 | DRV3- | Floppy disk active low open drain output that selects floppy drive 3 |  |
| 17 | GND |  |  |
| 18 | DRV0- | Floppy disk active low open drain output that selects floppy drive 0 |  |
| 19 | DRV2- | Floppy disk active low open drain output that selects floppy drive 2 |  |
| 20 | MTR1- | Floppy disk active low open drain output selects motor driver 1. The motor enable bits are software controlled via the floppy's Digital Output Register (DOR). |  |
| 21 | MTR3- | Floppy disk active low open drain output selects motor driver 3. The motor enable bits are software controlled via the floppy's Digital Output Register (DOR). |  |
| 22 | DIR | Floppy disk open drain output that controls floppy read/write head movement direction. Low=set pin. |  |
| 23 | STEP | Floppy disk active low output provides the step pulse to move the floppy read/write head |  |
| 24 | WDATA- | Floppy disk active lower signal writes precompensated serial data to the selected floppy drive. This is a high open current drain output and is gated internally with WGATE-. |  |
| 25 | WGATE- | Floppy disk active low open drain signal that enables the head to write onto the floppy disk. |  |
| 26 | TRK0- | Floppy disk active lower Schmitt input indicates that the head is on track 0 of the selected drive | IS |
| 27 | WRPRT- | Floppy disk active low Schmitt input indicating that the disk is write protected. Any WDATA-command is ignored. | IS |
| 28 | RDATA- | Floppy disk active lower Schmitt input that reads raw data from the floppy disk. | IS |
| 29 | HDSEL | Floppy disk open drain output that selects the head on the selected drive. Low=side 0. |  |
| 30 | DSKCHG | Floppy disk input signal indicating that the floppy door has been opened. | I |
| 31 | 5VBB |  |  |
| 32 | GND |  |  |
| 33 | PF1 | Powerfail |  |
| 34 | PF0 | Powerfail |  |
| 35 | MR- | Powerfail |  |
| 36 | RTCIRQ- | Alarm output from the onboard real time clock |  |
| 37 | WD0 | Watchdog timer |  |
| 38 | SA00 | ISA System Address 00 | O24 |
| 39 | OSC | ISA 14.318 MHz clock. This clock is asynchronous to all other system clocks |  |
| 40 | SA01 | ISA System Address 01 | O24 |
| 41 | SA02 | ISA System Address 02 | O24 |
| 42 | BALE | ISA Buffered Address Latch Enable |  |
| 43 | SA03 | ISA System Address 03 | O24 |
| 44 | SD15 | ISA System Data 15 |  |
| 45 | TC | ISA DMX Terminal Count |  |
| 46 | SA04 | ISA System Address 04 | O24 |
| 47 | MASTER- | ISA |  |
| 48 | SD14 | ISA System Data 14 |  |
| 49 | DACK2- | ISA DMA 2 Acknowledge strobe |  |
| 50 | SA05 | ISA System Address 05 | O24 |
| 51 | SD13 | ISA System Data 13 |  |
| 52 | IRQ3 | ISA Interrupt Request 3 | I |
| 53 | SA06 | ISA System Address 06 | O24 |
| 54 | DRQ7 | ISA DMA 7 Request | I |
| 55 | SD12 | ISA System Data 12 |  |
| 56 | IRQ4 | ISA Interrupt Request 4 | I |
| 57 | SA07 | ISA System Address 07 | O24 |
| 58 | DACK7- | ISA DMA 7 Acknowledge strobe |  |
| 59 | SD11 | ISA System Data 11 |  |
| 60 | IRQ5 | ISA Interrupt Request 5 | I |
| 61 | SA08 | ISA System Address 08 | O24 |
| 62 | DRQ6 | ISA DMA 6 Request | I |
| 63 | SD10 | ISA System Data 10 |  |
| 64 | IRQ6OUT | Floppy disk interrupt request. Normally connects to IRQ6 (pin 65) |  |
| 65 | IRQ6 | ISA Interrupt Request 6 | I |
| 66 | SA09 | ISA System Address 09 | O24 |
| 67 | GND |  |  |
| 68 | DACK6- | ISA DMA 6 Acknowledge strobe |  |
| 69 | SD09 | ISA System Data 09 |  |
| 70 | IRQ7OUT | Parallel port interrupt request, Normally connects to IRQ7 (pin 71). |  |
| 71 | IRQ7 | ISA Interrupt Request 7 | I |
| 72 | SA10 | ISA System Address 10 | O24 |
| 73 | DRQ5 | ISA DMA 5 Request | I |
| 74 | SD08 | ISA System Data 08 |  |
| 75 | SYSCLK | ISA System Clock |  |
| 76 | SA11 | ISA System Address 11 | O24 |
| 77 | DACK5- | ISA DMA 5 Acknowledge strobe |  |
| 78 | MEMW- | ISA active low memory write strobe |  |
| 79 | REFRESH- | ISA active low signal indicating current bus cycle is a memory refresh |  |
| 80 | SA12 | ISA System Address 12 | O24 |
| 81 | DRQ0 | ISA DMA 0 Request | I |
| 82 | MEMR- | ISA active low memory read strobe |  |
| 83 | DRQ1 | ISA DMA 1 Request | I |
| 84 | SA13 | ISA System Address 13 | O24 |
| 85 | VCC |  |  |
| 86 | DACK0- | ISA DSMA 0 Acknowledge strobe |  |
| 87 | LA17 | ISA Latched Address 17 | O24 |
| 88 | DACK1- | ISA DMA 1 Acknowledge strobe |  |
| 89 | SA14 | ISA System Address 14 | O24 |
| 90 | IRQ14 | ISA Interrupt Request 14, normally used for IDE interface | I |

-continued

| Pin | Pin Name | Description | Type |
|---|---|---|---|
| 91 | LA18 | ISA Latched address 18 | O24 |
| 92 | DRQ3 | ISA DMA 3 Request strobe | |
| 93 | SA15 | ISA System Address 15 | O24 |
| 94 | IRQ15 | ISA Interrupt Request 15 | I |
| 95 | LA19 | ISA Latched Address 19 | O24 |
| 96 | DACK3- | ISA DMA 3 Acknowledge strobe | |
| 97 | SA16 | ISA System Address 16 | O24 |
| 98 | IRQ12 | ISA Interrupt Request 12 | I |
| 99 | LA20 | ISA Latched Address 20 | O24 |
| 100 | IOR- | ISA I/O Read strobe | |
| 101 | SA17 | ISA System Address 17 | O24 |
| 102 | GND | | |
| 103 | IRQ11 | ISA Interrupt Request 11 | I |
| 104 | LA21 | ISA Latched Address 21 | O24 |
| 105 | IOW- | ISA I/O Write strobe | |
| 106 | SA18 | ISA System Address 18 | O24 |
| 107 | IRQ10 | ISA Interrupt Request 10 | I |
| 108 | LA22 | ISA Latched Address 22 | O24 |
| 109 | SMEMR- | ISA System Memory Read strobe | |
| 110 | SA19 | ISA System Address 19 | O24 |
| 111 | IOCS16- | ISA 16-bit I/O Chip Select request. Indicates that the current I/O transaction is 16-bits. | I |
| 112 | LA23 | ISA Latched Address 23 | O24 |
| 113 | SMEMW- | ISA System Memory Write strobe | |
| 114 | AEN | ISA Address Enable | |
| 115 | MEMCS16 | ISA 16-bit Memory Chip Select request. Indicates that the current memory transaction is 16-bits. | I |
| 116 | SBHE- | ISA System Byte High Enable | |
| 117 | IOCHRDY | ISA I/O Channel Ready. A low adds wait states to the current ISA bus cycle | I |
| 118 | SD00 | ISA System Data 00 | |
| 119 | OWS- | ISA active low causing cuurent memory cycle to be controlled without additional wait states. | I |
| 120 | SD01 | ISA System Data 01 | |
| 121 | SD02 | ISA System Data 02 | |
| 122 | DRQ2OUT | Floppy DMA 2 Request. Normally connected to DRDQ2 (pin 123) | |
| 123 | DRQ2 | ISA DMA 2 Request strobe | |
| 124 | SD03 | ISA System Data 03 | |
| 125 | SD04 | ISA System Data 04 | |
| 126 | IRQ9 | ISA Interrupt Request 09 | |
| 127 | SD05 | ISA System Data 05 | |
| 128 | SD06 | ISA System Data 06 | |
| 129 | RESETDRV | ISA active high system reset signal | |
| 130 | IOCHCHK | ISA gated non-maskable interrupt input | |
| 131 | IOCHCHK- | ISA gated non-maskable interrupt input | I |
| 132 | HISPEED | Input to select CPU speed, High=high speed. | I |
| 133 | SPKR | Speaker output | |
| 134 | KDATA | Keyboard | |
| 135 | KCLOCK | Keyboard clock | |
| 136 | PWRDN- | | |
| 137 | GND | | |
| 138 | COLOR | Video Color/Mono jumper | I |
| 139 | KBLOCK | Keyboard lock. Low blocks keyboard input | I |
| 140 | SLCT | Parallel Port | |
| 141 | PE | Parallel Port | |
| 142 | BUSY | Parallel Port | |
| 143 | ACK- | Parallel Port | |
| 144 | PD7 | Parallel Port Data 7 | |
| 145 | PD6 | Parallel Port Data 6 | |
| 146 | PD5 | Parallel Port Data 5 | |
| 147 | PD4 | Parallel Port Data 4 | |
| 148 | PD3 | Parallel Port Data 3 | |
| 149 | SLCTIN- | Parallel Port | |
| 150 | PD2 | Parallel Port Data 2 | |
| 151 | INIT- | Parallel Port | |
| 152 | PD1 | Parallel Port Data 1 | |
| 153 | ERR- | Parallel Port | |
| 154 | GND | | |
| 155 | PD0 | Parallel Port Data 0 | |
| 156 | AUTOFD | Parallel Port | |
| 157 | STRB- | Parallel Port | |
| 158 | DCD2 | Serial Port 2 Data Carrier Detect | |

-continued

| Pin | Pin Name | Description | Type |
|---|---|---|---|
| 159 | DSR2 | Serial Port 2 Data Set Ready | |
| 160 | RXD2 | Serial Port 2 Receive Data | |
| 161 | RTS2 | Serial Port 2 Request To Send | |
| 162 | TXD2 | Serial Port 2 Transmit Data | |
| 163 | CTS2 | Serial Port 2 Clear To Send | |
| 164 | DTR2 | Serial Port 2 Data Terminal Ready | |
| 165 | RI2 | Serial Port 2 Ring Indicator | |
| 166 | DCD1 | Serial Port 1 Data Carrier Detect | |
| 167 | DSR1 | Serial Port 1 Data Set Ready | |
| 168 | RXD1 | Serial Port 1 Receive Data | |
| 169 | RTS1 | Serial Port 1 Request to Send | |
| 170 | TXD1 | Serial Port 1 Transmit Data | |
| 171 | CTS1 | Serial Port 1 Clear to Send | |
| 172 | DTR1 | Serial Port 1 Data Terminal Ready | |
| 173 | RI1 | Serial Port 1 Ring Indicator | |
| 174 | GAMECS | | |
| 175 | RAS3- | DRAM Row Address Strobe 3 | |
| 176 | RAS2- | DRAM Row Address Strobe 2 | |
| 177 | RAS1- | DRAM Row Address Strobe 1 | |
| 178 | RAS0- | DRAM Row Address Strobe 0 | |
| 179 | DP1 | DRAM parity bit for high byte memory | |
| 180 | DP0 | DRAM parity bit for low byte memory | |
| 181 | D15 | DRAM Data Bit 15 | |
| 182 | D07 | DRAM Data Bit 7 | |
| 183 | D14 | DRAM Data Bit 14 | |
| 184 | D06 | DRAm Data Bit 6 | |
| 185 | DRWE- | DRAM memory write strobe | |
| 186 | D13 | DRAM Data Bit 13 | |
| 187 | GND | | |
| 188 | D05 | DRAM Data Bit 5 | |
| 189 | MA10 | DRAM multiplexed memory address 10 | |
| 190 | MA09 | DRAM multiplexed memory address 9 | |
| 191 | MA08 | DRAM multiplexed memory address 8 | |
| 192 | D12 | DRAM Bata Bit 12 | |
| 193 | D04 | DRAM Data Bit 4 | |
| 194 | MA07 | DRAM multiplexed memory address 7 | |
| 195 | MA06 | DRAM multiplexed memory address 6 | |
| 196 | D11 | DRAM Data Bit 11 | |
| 197 | D03 | DRAM Data Bit 3 | |
| 198 | MA05 | DRAM multiplexed memory address 5 | |
| 199 | MA04 | DRAM multiplexed memory address 4 | |
| 200 | D10 | DRAM Data Bit 10 | |
| 201 | D02 | DRAM Data Bit 2 | |
| 202 | MA03 | DRAM multiplexed memory address 3 | |
| 203 | MA02 | DRAM multiplexed memory address 2 | |
| 204 | D09 | DRAM Data Bit 9 | |
| 205 | VCC | | |
| 206 | D01 | DRAM Data Bit 1 | |
| 207 | MA01 | DRAM multiplexed memory address 1 | |
| 208 | MA00 | DRAM multiplexed memory address 0 | |
| 209 | D08 | DRAM Data Bit 8 | |
| 210 | D00 | DRAM Data Bit 0 | |
| 211 | CASH3- | DRAM Column Address Strobe, High byte 3 | |
| 212 | CASL3- | DRAM Column Address Strobe, Low byte 3 | |
| 213 | CASH2- | DRAM Column Address Strobe, High byte 2 | |
| 214 | CASL2- | DRAM Column Address Strobe, Low byte 2 | |
| 215 | CASH1- | DRAM Column Address Strobe, High byte 1 | |
| 216 | CASL1- | DRAM Column Address Strobe, Low byte 1 | |
| 217 | CASH0- | DRAM Column Address Strobe, High byte 0 | |
| 218 | CASL0- | DRAM Column Address Strobe, Low byte 0 | |
| 219 | BDIS | | |
| 220 | XROMCS- | | |
| 221 | LEDOUT- | | |
| 222 | GND | | |
| 223 | HDRESET- | IDE | |
| 224 | IDE07 | IDE Data Bit 7 | |
| 225 | HDD08 | IDE Data Bit 8 | |
| 226 | HDD06 | IDE Data Bit 6 | |
| 227 | HDD09 | IDE Data Bit 9 | |
| 228 | HDD05 | IDE Data Bit 5 | |
| 229 | HDD10 | IDE Data Bit 10 | |
| 230 | HDD04 | IDE Data Bit 4 | |
| 231 | HDD11 | IDE Data Bit 11 | |
| 232 | HDD03 | IDE Data Bit 3 | |
| 233 | HDD12 | IDE Data Bit 12 | |
| 234 | HDD02 | IDE Data Bit 2 | |
| 235 | HDD13 | IDE Data Bit 13 | |
| 236 | HDD01 | IDE Data Bit 1 | |

-continued

| Pin | Pin Name | Description | Type |
|---|---|---|---|
| 237 | HDD14 | IDE Data Bit 14 | |
| 238 | HDD00 | IDE Data Bit 0 | |
| 239 | HDD15 | IDE Data Bit 15 | |
| 240 | HDIOW- | IDE buffered I/O Write strobe | |

As mentioned above, the core logic 26 supports a DRAM bus 22 and an ISA compatible expansion bus 24 complying in number and signal type with the IEEE-P996 requirements (and corresponding to the ISA (Industry Standard Architecture) requirements). The pin configuration for the expansion bus 24 is given in the table below with corresponding pin numbers for expansion bus connectors A, B, C, D. The bus 24 comprises 94 pins that includes VCC and two GND pins.

| Pin | | Signal Name | Function | In/Out | Current | Load* |
|---|---|---|---|---|---|---|
| 38 | A31 | SA0 | Address bit 0 | I/O | 12 mA | PU |
| 39 | B30 | OSC | 14.318 MHz clock | Out | 6 mA | 33 SER |
| 40 | A30 | SA1 | Address bit 1 | I/O | 12 mA | PU |
| 41 | A29 | SA2 | Address bit 2 | I/O | 12 mA | PU |
| 42 | B28 | BALE | Address latch enable | Out | 12 mA | |
| 43 | A28 | SA3 | Address bit 3 | I/O | 12 mA | PU |
| 44 | C18 | SD15 | System Data bit 15 | I/O | 12 mA | PU |
| 45 | B27 | TC | DMA Terminal Count | Out | 4 mA | |
| 46 | A27 | SA4 | Address bit 4 | I/O | 12 mA | PU |
| 47 | D17 | MASTER- | Bus master assert | In | N/A | 330 PU |
| 48 | C17 | SD14 | System Data bit 14 | I/O | 24 mA | PU |
| 49 | B26 | DACK2- | DMA Acknowledge 2 | Out | 4 mA | |
| 50 | A26 | SA5 | Address bit 5 | I/O | 12 mA | PU |
| 51 | C16 | SD13 | System Data bit 13 | I/O | 24 mA | PU |
| 52 | B25 | IRQ3 | Interrupt Request 3 | In | N/A | PU |
| 53 | A25 | SA6 | Address bit 6 | I/O | 12 mA | PU |
| 54 | D15 | DRQ7 | DMA Request 7 | In | N/A | PD |
| 55 | C15 | SD12 | System Data bit 12 | I/O | 24 mA | PU |
| 56 | B24 | IRQ4 | Interrupot Request 4 | In | N/A | PU |
| 57 | A24 | SA7 | Address bit 7 | I/O | 12 mA | PU |
| 58 | D14 | DACK7- | DMA Acknowledge 7 | Out | 4 mA | |
| 59 | C14 | SD11 | System Data bit 11 | I/O | 24 mA | PU |
| 60 | B23 | IRQ5 | Interrupt Request 5 | In | N/A | PU |
| 61 | A23 | SA8 | Address bit 8 | I/O | 12 mA | PU |
| 62 | D13 | DRQ6 | DMA Request 6 | In | N/A | PD |
| 63 | C13 | SD10 | System Data bit 10 | I/O | 24 mA | PU |
| 64 | | IRQ6OUT | Floppy Disk Interrupt Request | | | |
| 65 | B22 | IRQ6 | Interrupt Request 6 | In | N/A | PU |
| 66 | A22 | SA9 | Address bit 9 | I/O | 12 mA | PU |
| 67 | | GND | | | | |
| 68 | D12 | DACK6- | DMA Acknowledge 6 | Out | 4 mA | |
| 69 | C12 | SD9 | System Data bit 9 | I/O | 24 mA | PU |
| 70 | | IRQ7OUT | Parallel Port Interrupt Request | | | |
| 71 | 821 | IRQ7 | Interrupt Request 7 | In | N/A | PU |
| 72 | A21 | SA10 | Address bit 10 | I/O | 12 mA | PU |
| 73 | D11 | DRQ5 | DMA Request 5 | In | N/A | PD |
| 74 | C11 | SD8 | System Data bit 8 | I/O | 24 mA | PU |
| 75 | B20 | SYSCLK | System clock (8 MHz) | Out | 12 mA | |
| 76 | A20 | SA11 | Address bit 11 | I/O | 12 mA | PU |
| 77 | D10 | DACK5- | DMA Acknowledge 5 | Out | 4 mA | |
| 78 | C10 | MEMW- | Memory Write | I/O | 6 mA | PU, 33 SER |
| 79 | B19 | REFRESH- | Memory Refresh | I/O | 6 mA | 470 PU, 33 SER |
| 80 | A19 | SA12 | Address bit 12 | I/O | 12 mA | PU |
| 81 | D9 | DRQ0 | DMA Request 9 | In | N/A | PD |

-continued

| Pin | | Signal Name | Function | In/Out | Current | Load* |
|---|---|---|---|---|---|---|
| 82 | C9 | MEMR- | Memory Read | I/O | 6 mA | PU, 33 SER |
| 83 | B18 | DRQ1 | DMA Request 1 | In | N/A | PD |
| 84 | A18 | SAT3 | Address bit 13 | I/O | 12 mA | PU |
| 85 | | VCC | | | | |
| 86 | D8 | DACK0- | DMA Acknowledge 0 | Out | 4 mA | |
| 87 | C8 | LA17 | Address bit 17 | I/O | 24 mA | |
| 88 | B17 | DACK1- | DMA Acknowledge 1 | Out | 4 mA | |
| 89 | A17 | SA14 | Address bit 14 | I/O | 12 mA | PU |
| 90 | D7 | IRQ14 | Interrupt Request 14 | In | N/A | PU |
| 91 | C7 | LA18 | Address bit 18 | I/O | 24 mA | |
| 92 | B16 | DRQ3 | DMA Request 3 | In | N/A | PD |
| 93 | A16 | SA15 | Address bit 15 | I/O | 12 mA | PU |
| 94 | D6 | IRQ15 | Interrupt Request 15 | In | N/A | PU |
| 95 | C6 | LA19 | Address bit 19 | I/O | 24 mA | |
| 96 | B15 | DACK3- | DMA Acknowledge 3 | Out | 4 mA | |
| 97 | A15 | SA16 | Address bit 16 | I/O | 12 mA | PU |
| 98 | D5 | IRQ12 | Interrupt Request 12 | In | N/A | PU |
| 99 | C5 | LA20 | Address bit 20 | I/O | 24 mA | |
| 100 | B14 | IRQ- | I/O Read | I/O | 6 mA | PU |
| 101 | A14 | SA17 | Address bit 17 | I/O | 12 mA | PU |
| 102 | | GND | | | | |
| 103 | D4 | IRQ11 | Interrupt Request 11 | In | N/A | PU |
| 104 | C4 | LA21 | Address bit 21 | I/O | 24 mA | |
| 105 | B13 | IOW- | I/O Write | I/O | 6 mA | PU |
| 106 | A13 | SA18 | Address bit 18 | I/O | 12 mA | PU |
| 107 | D3 | IRQ10 | Interrupt Request 10 | In | N/A | PU |
| 108 | C3 | LA22 | Address bit 22 | I/O | 24 mA | |
| 109 | B12 | SMEMR- | Mem Read (lower 1MB) | I/O | 6 mA | 33 SER |
| 110 | A12 | SA19 | Address bit 19 | I/O | 12 mA | PU |
| 111 | D2 | IOCS16- | 16-bit I/O access | In | N/A | 330 PU |
| 112 | C2 | LA23 | Address bit 23 | I/O | 24 mA | |
| 113 | B11 | SMEMW- | Mem Write (lower 1 MB) | I/O | 6 mA | 33 SER |
| 114 | A11 | AEN | Address Enable | I/O | 12 mA | PU |
| 115 | D1 | MEMCS16- | 16-bit mem access | In | N/A | 330 PU |
| 116 | C1 | SBHE- | Bus High Enable | I/O | 12 mA | PU |
| 117 | A10 | IOCHRDY | Processor Ready Ctrl | In | N/A | 1K PU |
| 118 | A9 | SD00 | System Data bit 0 | I/O | 24 mA | PU |
| 119 | B8 | ENDXFR- (OWS-) | Zero wait state | In | N/A | 330 PU |
| 120 | A8 | SD1 | System Data bit 1 | I/O | 24 mA | PU |
| 121 | A7 | SD2 | System Data bit 2 | I/O | 24 mA | PU |
| 122 | | DRQ2OUT | Floppy DMA 2 Request | | | |
| 123 | B6 | DRQ2 | DMA Request 2 | In | N/A | PD |
| 124 | A6 | SD3 | System Data bit 3 | I/O | 24 mA | PU |
| 125 | A5 | SD4 | System Data bit 4 | I/O | 24 mA | PU |
| 126 | B4 | IRQ9 | Interrupt request 9 | In | N/A | PU |
| 127 | A4 | SD5 | System Data bit 5 | I/O | 24 mA | PU |
| 128 | A4 | SD6 | System Data bit 6 | I/O | 24 mA | PU |
| 129 | B2 | RESETDRV | System reset signal | Out | 24 mA | |
| 130 | A2 | SD7 | System Data bit 7 | I/O | 24 mA | PU |
| 131 | A1 | IOCHCK- | Sub NMI input | In | N/A | 4.7K PU |

The exact pin configuration as illustrated for the expansion bus on Page 5 is a critical feature of the invention. Since it forms a single row of pins on the module 10, the pins can be easily connected directly to the expansion bus connectors without having to resort to multiple layer boards to route the PC board tracks from the module 10 to the expansion bus connectors A, B, C, D. Furthermore, as mentioned above, the present invention includes both microprocessor modules as illustrated in FIG. 3, as well as peripheral controller modules such as display controller modules, Ethernet control modules, and PCMCIA compatible modules for extended memory (RAM, ROM, EEPROM, flash memory, etc.), as well as for modem, fax, and network interfaces, and also for wireless communication devices. By providing an identical pin configuration for the ISA buses, the various modules can easily be connected to one another.

Figure 5:
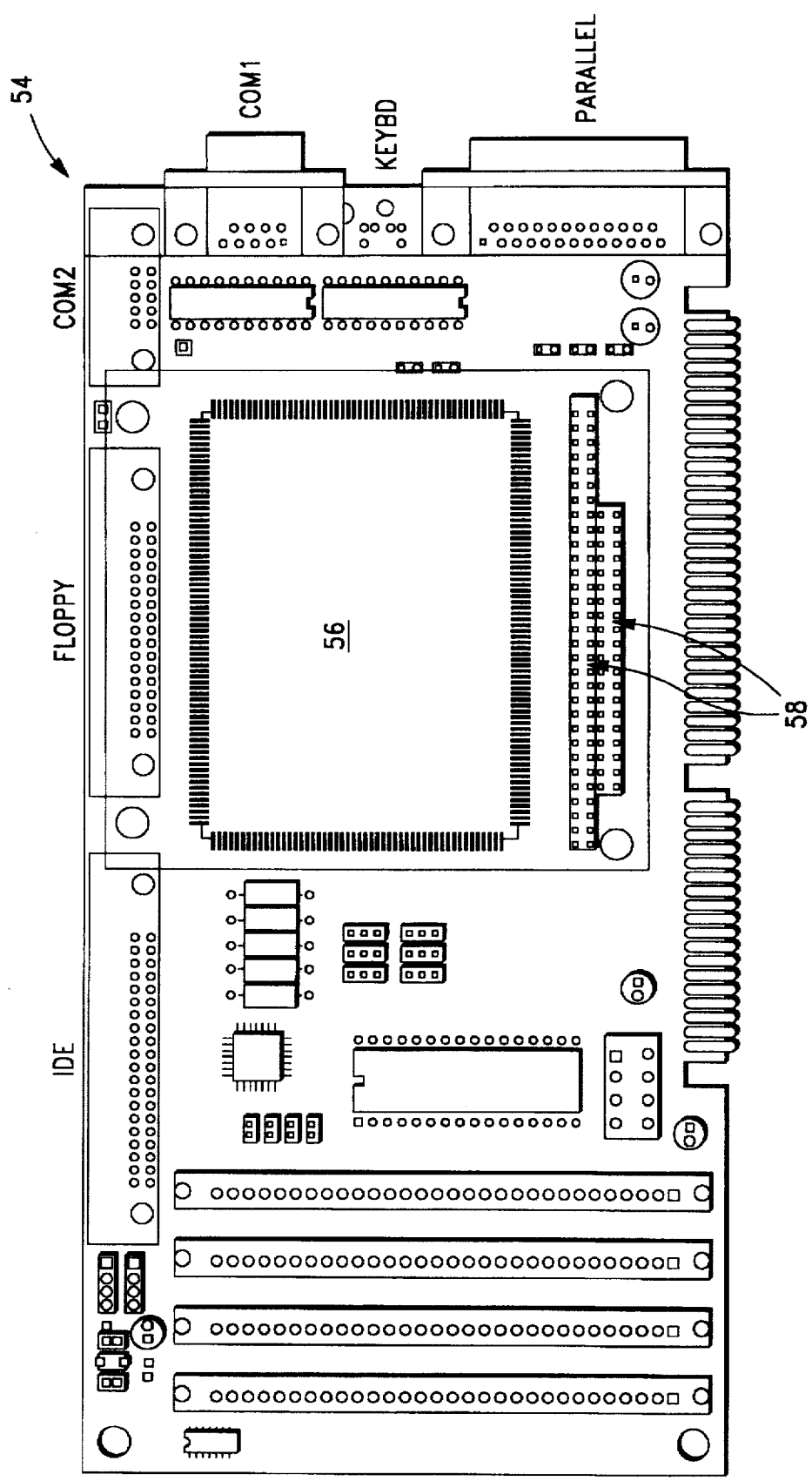
FIG. 5 shows a PC board layout for a development board showing the mounting site for the module of FIG. 1.
Figure 6:
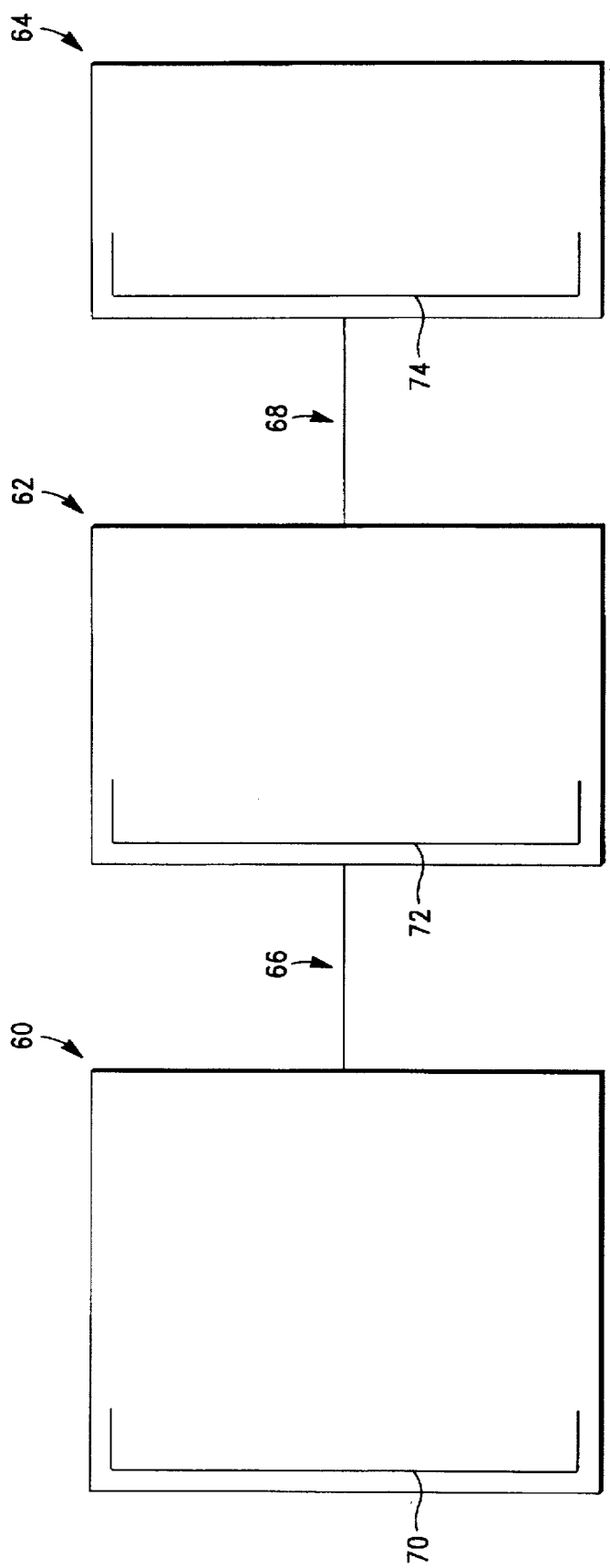
FIG. 6 is a schematic representation of a number of different modules in accordance with the invention connected to each other by means of their ISA buses to form a module family of the invention.

A further feature of the invention is illustrated in FIG. 5. FIG. 5 illustrates a card 54 having a mounting site 56 for a module having a pin configuration as described above with reference to FIG. 4. The card 54 provides an integrated way for system development in standard ISA passive backplane systems. The card includes an AT-bus and a PC/104 bus, and occupies a single slot in an AT-class (16-bit) passive backplane. This allows development to be performed using a terminal on a serial port as a console. A standard VGA or SVGA display controller can be plugged into another slot on the backplane if desired. Instead, a PC/104 display controller can be installed directly on the PC/104 header 58 on the card 54. Since the module 10 is fully compatible with PC/AT ISA, a wide selection of hardware peripherals may be integrated. The ISA-compatible bus allows an OEM to easily interface his proprietary hardware design with the module 10. Furthermore, the standard BIOS and embedded DOS allows application software to be developed using standard desk top PCs and standard development tools for implementation on the system using one or more modules of the present invention. It will be appreciated that, depending on the nature of the module, the size of the module and the number of pins may vary, however it is an important feature of this invention that the pins for the ISA bus retain their configuration in each module to allow the modules to be readily connected to one another as illustrated in FIG. 6 in which different modules 60, 62, 64 of the invention are connected to each other by means of bus lines 66, 68 extending between the ISA compatible bus pins indicated by reference numerals 70, 72, 74, respectively.

We claim:

1. A multi-chip module comprising
a plurality of functional circuits provided on a substrate, the circuits defining a plurality of signal inputs and outputs, and
a plurality of module pins secured in a single row along the periphery of the substrate and connected to the inputs and outputs, the module pins including a set of 91 signal pins, two ground pins and a power pin, defining an ISA bus means, the signal pins having a configuration complying in number and signal type with the IEEE-P996 requirements,
wherein the module is rectangular in shape, having a first side, a second side opposite the first side, a third side, and a fourth side, and is defined by an upper surface, a lower surface, and a peripheral wall, and wherein the plurality of pins extend from the peripheral wall,
wherein the pins of the ISA bus means comprise
pin 38 corresponding to signal SA0;
pin 39 corresponding to signal OSC;
pin 40 corresponding to signal SA1;
pin 41 corresponding signal SA2;
pin 42 corresponding to signal BALE;
pin 43 corresponding to signal SA3;
pin 44 corresponding to signal SD15;
pin 45 corresponding to signal TC;
pin 46 corresponding to signal SA4;
pin 47 corresponding to signal MASTER-;
pin 48 corresponding to signal SD14;
pin 49 corresponding to signal DACK2-;
pin 50 corresponding to signal SA5;
pin 51 corresponding to signal SD13;
pin 52 corresponding to signal IRQ3;
pin 53 corresponding to signal SA6;
pin 54 corresponding to signal DRQ7;
pin 55 corresponding to signal SD12;
pin 56 corresponding to signal IRQ4;
pin 57 corresponding to signal SA7;
pin 58 corresponding to signal DACK7-;
pin 59 corresponding to signal SD11;
pin 60 corresponding to signal IRQ5;
pin 61 corresponding to signal SA8;
pin 62 corresponding to signal DRQ6;
pin 63 corresponding to signal SD10;
pin 64 corresponding to signal IRQ6OUT;
pin 65 corresponding to signal IRQ6;
pin 66 corresponding to signal SA9;
pin 67 corresponding to GND;
pin 68 corresponding to signal DACK6-;
pin 69 corresponding to signal SD9;
pin 70 corresponding to signal IRQ7OUT;
pin 71 corresponding to signal IRQ7;
pin 72 corresponding to signal SA10;
pin 73 corresponding to signal DRQ5;
pin 74 corresponding to signal SD8;
pin 75 corresponding to signal SYSCLK;
pin 76 corresponding to signal SA11;
pin 77 corresponding to signal DACK5-;
pin 78 corresponding to signal MEMW-;
pin 79 corresponding to signal REFRESH-;
pin 80 corresponding to signal SA12;
pin 81 corresponding to signal DRQ0;
pin 82 corresponding to signal MEMR-;
pin 83 corresponding to signal DRQ1;
pin 84 corresponding to signal SA13;
pin 85 corresponding to VCC;
pin 86 corresponding to signal DACK0-;
pin 87 corresponding to signal LA17;
pin 88 corresponding to signal DACK1-;
pin 89 corresponding to signal SA14;
pin 90 corresponding to signal IRQ14;
pin 91 corresponding to signal LA18;
pin 92 corresponding to signal DRQ3;
pin 93 corresponding to signal SA15;
pin 94 corresponding to signal IRQ15;
pin 95 corresponding to signal LA19;
pin 96 corresponding to signal DACK3-;
pin 97 corresponding to signal SA16;
pin 98 corresponding to signal IRQ12;
pin 99 corresponding to signal LA20;
pin 100 corresponding to signal IOR-;
pin 101 corresponding to signal SA17;
pin 102 corresponding to GND;
pin 103 corresponding to signal IRQ11;
pin 104 corresponding to signal LA21;
pin 105 corresponding to signal IOW-;
pin 106 corresponding to signal SA18;
pin 107 corresponding to signal IRQ10;
pin 108 corresponding to signal LA22;
pin 109 corresponding to signal SMEMR-;
pin 110 corresponding to signal SA19;

pin 111 corresponding to signal IOCS16-;
pin 112 corresponding to signal LA23;
pin 113 corresponding to signal SMEMW-;
pin 114 corresponding to signal AEN;
pin 115 corresponding to signal MEMCS16-;
pin 116 corresponding to signal SBHE-;
pin 117 corresponding to signal IOCHRDY;
pin 118 corresponding to signal SD00;
pin 119 corresponding to signal (0WS-);
pin 120 corresponding to signal SD1;
pin 121 corresponding to signal SD2;
pin 122 corresponding to signal DRQ2OUT;
pin 123 corresponding to signal DRQ2;
pin 124 corresponding to signal SD3;
pin 125 corresponding to signal SD4;
pin 126 corresponding to signal IRQ9;
pin 127 corresponding to signal SD5;
pin 128 corresponding to signal SD6;
pin 129 corresponding to signal RESETDRV;
pin 130 corresponding to signal SD7; and
pin 131 corresponding to signal IOCHCK.

2. A multi-chip module of claim 1, wherein the pins of the ISA bus means extend along the first side and at least partially along the third and fourth sides.

* * * * *